US011750183B1

United States Patent
Lin

(10) Patent No.: US 11,750,183 B1
(45) Date of Patent: Sep. 5, 2023

(54) CLOCK SIGNAL GENERATOR AND CLOCK SIGNAL GENERATING METHOD THEREOF

(71) Applicant: Winbond Electronics Corp., Taichung (TW)

(72) Inventor: Che-Min Lin, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/878,037

(22) Filed: Jul. 31, 2022

(51) Int. Cl.
  *G06F 1/08* (2006.01)
  *H03K 5/135* (2006.01)

(52) U.S. Cl.
  CPC .............. *H03K 5/135* (2013.01); *G06F 1/08* (2013.01)

(58) Field of Classification Search
  CPC ......................................................... G06F 1/08
  USPC ........................................................ 327/291
  See application file for complete search history.

(56) References Cited

U.S. PATENT DOCUMENTS

| 4,641,044 | A | 2/1987 | Shiraishi |
| 6,204,694 | B1 | 3/2001 | Sunter et al. |
| 8,174,300 | B2 | 5/2012 | Chen et al. |
| 2005/0140403 | A1* | 6/2005 | Lee ................ H03K 5/00006 327/122 |

OTHER PUBLICATIONS

"Office Action of Taiwan Counterpart Application", dated Apr. 10, 2023, p. 1-p. 10.

* cited by examiner

*Primary Examiner* — Tomi Skibinski
(74) *Attorney, Agent, or Firm* — JCIPRNET

(57) ABSTRACT

A clock signal generator and a clock signal generating method are provided. The clock signal generator is adapted for a test machine. The clock signal generator includes a first oscillator, a second oscillator, a delay value generator, and an output clock signal generator. The first oscillator and the second oscillator are activated alternatively. The first oscillator generates a first clock signal with a first frequency according to a delay value. The second oscillator generates a second clock signal with a second frequency according to the delay value, where phases of the first clock signal and the second clock signal are different. The delay value generator detects a pulse width of a reference pulse signal to generate the delay value. The output clock signal generator combines the first clock signal and the second clock signal to generate an output clock signal.

20 Claims, 5 Drawing Sheets

CLOCK SIGNAL GENERATOR AND CLOCK SIGNAL GENERATING METHOD THEREOF

BACKGROUND

Technical Field

The disclosure relates to a clock signal generator and a clock signal generating method thereof, and in particular relates to a clock signal generator of a test machine and a clock signal generating method thereof.

Description of Related Art

In the testing of integrated circuits, it is often necessary to use a test machine to provide a testing clock signal for execution. When a high frequency test clock signal is required, a high-end test machine may be selected for execution, but such an approach will cause a substantial increase in the test cost. Therefore, in the prior art, a general test machine may be used, and the frequency of the test clock signal may be increased by multiplying the test clock signal provided by the test machine.

In the prior art, a cutting signal may be provided externally to cut the signal waveform according to the test clock signal provided by the test machine, to complete the frequency multiplication. The transition edge of the frequency-multiplied test clock signal generated by this method is often unstable, which reduces the stability and accuracy of the test.

SUMMARY

The disclosure provides a clock signal generator and a clock signal generating method thereof, which may provide a test machine with a relatively high frequency output clock signal.

The clock signal generator of the disclosure includes a first oscillator, a second oscillator, a delay value generator, and an output clock signal generator. The first oscillator is periodically activated according to a first control signal, and the first oscillator generates a first clock signal with a first frequency according to a delay value. The second oscillator is periodically activated according to a second control signal, and the second oscillator generates a second clock signal with a second frequency according to the delay value, in which phases of the first clock signal and the second clock signal are different. The delay value generator is coupled to the first oscillator and the second oscillator. The delay value generator detects a pulse width of a reference pulse signal to generate the delay value. The output clock signal generator is coupled to the first oscillator and the second oscillator, and combines the first clock signal and the second clock signal to generate an output clock signal.

A clock signal generating method of the disclosure includes the following process. A first oscillator is provided to be periodically activated according to a first control signal, and a first clock signal with a first frequency is generated according to a delay value. A second oscillator is provided to be periodically activated according to a second control signal, and a second clock signal with a second frequency is generated according to the delay value, in which phases of the first clock signal and the second clock signal are different. A pulse width of a reference pulse signal is detected to generate the delay value. The first clock signal and the second clock signal are combined to generate an output clock signal.

Based on the above, the clock signal generator and the clock signal generating method thereof of the disclosure may select two clock signals through time division interleaving to generate an output clock signal. In this way, the clock signal generator may generate an output clock signal having a relatively high frequency. In the testing of the integrated circuit, the test clock signal for executing the test may be accelerated, improving the execution speed of the test.

DETAILED DESCRIPTION OF DISCLOSED EMBODIMENTS

Figure 1:
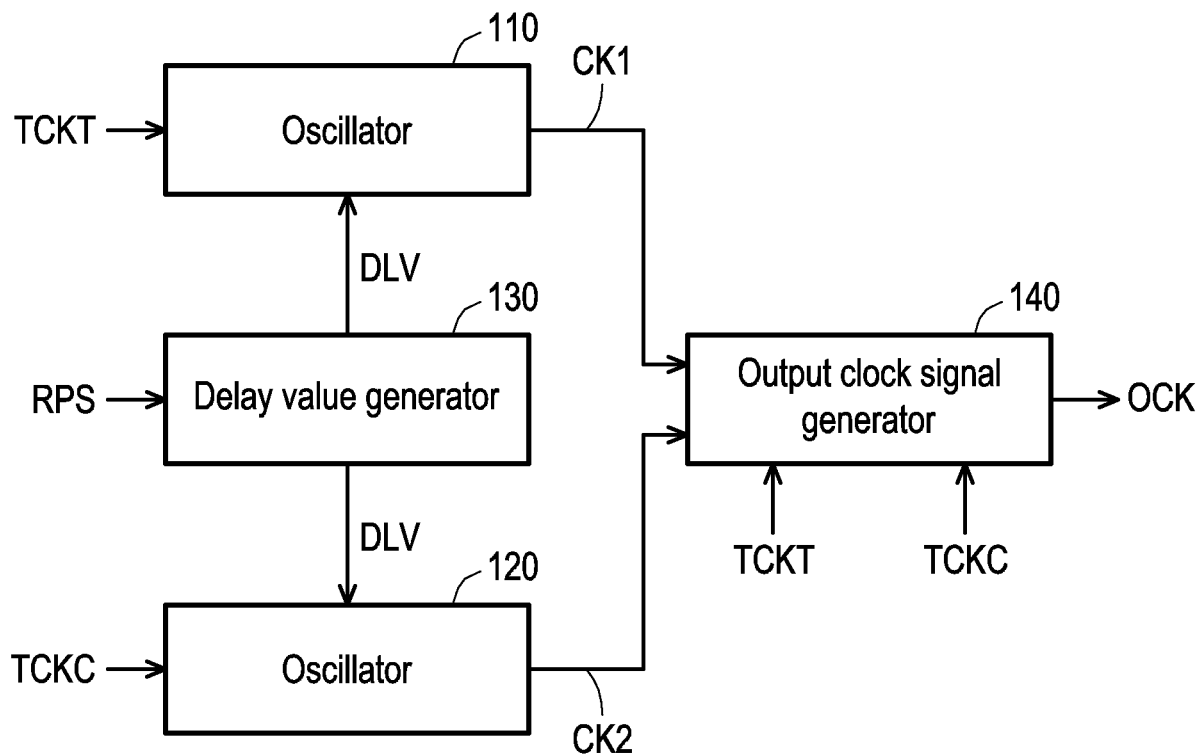
FIG. 1 is a schematic diagram of a clock signal generator according to an embodiment of the disclosure.

Referring to FIG. 1, a clock signal generator 100 is adapted for a test machine of an integrated circuit. The clock signal generator 100 includes an oscillator 110, an oscillator 120, a delay value generator 130, and an output clock signal generator 140. In this embodiment, the oscillator 110 is periodically activated according to a control signal TCKT, and the oscillator 110 generates a first clock signal CK1 with a first frequency according to the delay value DLV. The oscillator 120 may be periodically activated according to a control signal TCKC, and the oscillator 120 generates a second clock signal CK2 with a second frequency according to the delay value DLV. The first frequency and the second frequency may be the same.

Please note here that the control signal TCKT and the control signal TCKC may be two clock signals with opposite phases, and the frequencies of the control signal TCKT and the control signal TCKC may be equal to the test clock signals supplied by the test machine. In this embodiment, the oscillator 110 and the oscillator 120 may be activated or deactivated according to the voltage values of the control signal TCKT and the control signal TCKC, respectively. When the control signal TCKT is a logic value of 1 (the control signal TCKC is a logic value of 0), the oscillator 110 is activated and the oscillator 120 is deactivated; when the control signal TCKT is a logic value of 0 (control signal TCKC is a logic value of 1), the oscillator 120 is activated and oscillator 110 is deactivated. That is, the oscillator 110 and the oscillator 120 may be alternatively activated or deactivated.

In this embodiment, the control signal TCKT may be a test clock signal that may be provided by the test machine.

The delay value generator 130 is coupled to the oscillator 110 and the oscillator 120. The delay value generator 130 receives a reference pulse signal RPS, and generates the delay value DLV according to a detected pulse width of the reference pulse signal RPS. In this embodiment, the reference pulse signal RPS provides a reference pulse. The pulse width of the reference pulse may be equal to a half period of the control signal TCKT. That is, the delay value generator 130 may generate the delay value DLV according to a half period of the control signal TCKT.

In this embodiment, the delay value DLV provided by the delay value generator 130 to the oscillator 110 and the oscillator 120 may be the same.

The output clock signal generator 140 is coupled to the oscillator 110 and the oscillator 120. The output clock signal generator 140 receives the first clock signal CK1 and the second clock signal CK2 respectively generated by the oscillator 110 and the oscillator 120, and receives the control signal TCKT and the control signal TCKC. The output clock signal generator 140 is configured to combine the first clock signal CK1 and the second clock signal CK2 to generate an output clock signal OCK. In detail, the output clock signal generator 140 may selectively output the first clock signal CK1 or the second clock signal CK2 according to the control signal TCKT and the control signal TCKC to generate the output clock signal OCK. Specifically, when the control signal TCKT is a logic value of 1 (the control signal TCKC is a logic value of 0), the output clock signal generator 140 selects to output the first clock signal CK1 to generate the output clock signal OCK; when the control signal TCKT is a logic value of 0 (the control signal TCKC is a logic value of 1), the output clock signal generator 140 selects to output the second clock signal CK2 to generate the output clock signal OCK.

By combining the first clock signal CK1 and the second clock signal CK2 to generate the output clock signal OCK, the frequency of the output clock signal OCK generated by the output clock signal generator 140 may be twice the frequency of the first clock signal CK1 and the frequency of the second clock signal CK2. The frequency of the first clock signal CK1 and the second clock signal CK2 generated based on the control signal TCKT and the control signal TCKC may be equal to the frequencies of the control signal TCKT and the control signal TCKC, that is, the frequency of the output clock signal OCK generated by the clock signal generator 100 of the disclosure may be twice the frequency of the control signal TCKT and the control signal TCKC. The clock signal generator 100 may provide the output clock signal OCK as the test clock signal for performing the test, which may speed up the test.

It is worth mentioning that, since the delay value generator 130 generates the delay value DLV based on the half period of the control signal TCKT, the oscillator 110 and the oscillator 120 generate the first clock signal CK1 and the second clock signal CK2 according to the delay value DLV. Therefore, the first clock signal CK1 and the second clock signal CK2 may be two clock signals with a fixed phase difference, and this phase difference may be associated with the half period of the control signal TCKT. Therefore, the output clock signal OCK generated by the clock signal generator 100 may be a clock signal with a stable transition edge, so that the test may be performed stably.

Figure 2:
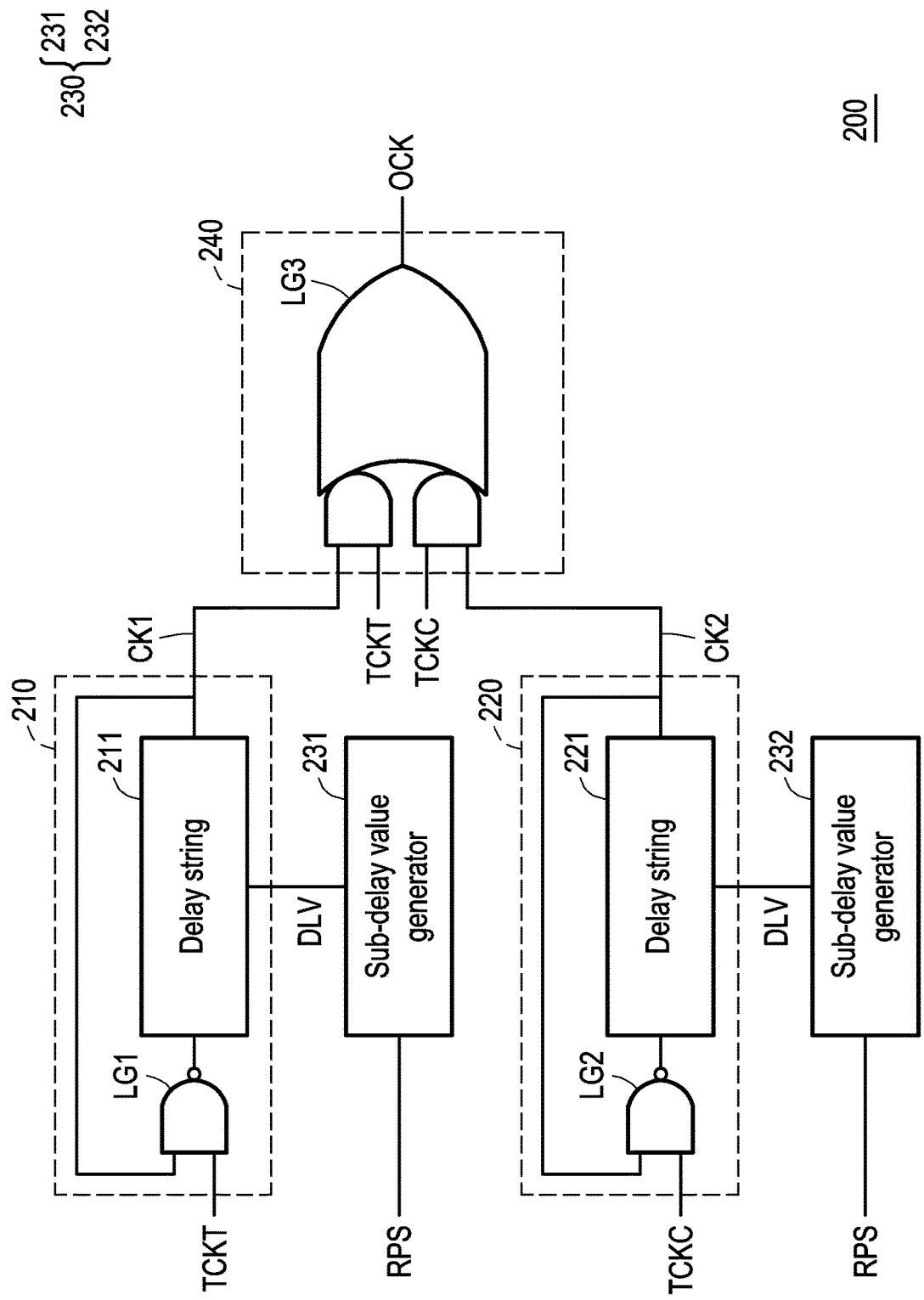
FIG. 2 is a schematic circuit diagram of a clock signal generator according to another embodiment of the disclosure.

Referring to FIG. 2, a clock signal generator 200 includes an oscillator 210, an oscillator 220, a delay value generator 230 composed of a sub-delay value generator 231 and a sub-delay value generator 232, and an output clock signal generator 240. In this embodiment, the oscillator 210 is a ring oscillator, which includes a delay string 211 and a logic gate LG1. The logic gate LG1 is coupled between the paths of the delay string 211 for receiving the control signal TCKT, the two input terminals of the logic gate LG1 respectively receive the control signal TCKT and the first clock signal CK1, and the output terminal of the logic gate LG1 is coupled to the input terminal of the delay string 211.

In this embodiment, the logic gate LG1 may be a NAND gate. When the control signal TCKT is a logic value of 1, the logic gate LG1 transfers to the delay string 211 through the inverted signal of the first clock signal CK1, and the delay string 211 delays the received signal (the inverse signal of the first clock signal CK1) according to the delay value DLV. In this way, the oscillator 210 may generate the first clock signal CK1 with a period equal to twice the delay value DLV.

The oscillator 220 is also a ring oscillator, including a delay string 221 and a logic gate LG2. The logic gate LG2 is coupled between the paths of the delay string 221 for receiving the control signal TCKC, the two input terminals of the logic gate LG2 respectively receive the control signal TCKC and the second clock signal CK2, and the output terminal of the logic gate LG2 is coupled to the input terminal of the delay string 221. The operation details of the oscillator 220 are similar to those of the oscillator 210, and are omitted herein.

In this embodiment, the output clock signal generator 240 may be a signal selector, and may be constructed by using a logic gate LG3. The logic gate LG3 is a combined logic gate composed of two AND gates and one OR gate. The logic gate LG3 may perform AND logic operations on the control signal TCKT and the first clock signal CK1 to generate a first signal. The logic gate LG3 may perform AND logic operations on the control signal TCKC and the second clock signal CK2 to generate a second signal. The logic gate LG3 performs OR logic operation on the first signal and the second signal to generate the output clock signal OCK.

Different from the previous embodiments, the delay value generator 230 in this embodiment is divided into two sub-delay value generators 231 and 232. The sub-delay value generator 231 and the sub-delay value generator 232 are respectively coupled to the oscillator 210 and the oscillator 220, and are configured to provide the delay value DLV to the delay string 211 and the delay string 221. The sub-delay value generator 231 and the sub-delay value generator 232 receive the reference pulse signal RPS, and detect the pulse width of the reference pulse signal RPS to generate the delay value DLV. In this embodiment, the delay values DLV generated by the sub-delay value generator 231 and the sub-delay value generator 232 may be the same. Also, the sub-delay value generator 231 and the sub-delay value generator 232 may have the same circuit structure.

Figure 3:
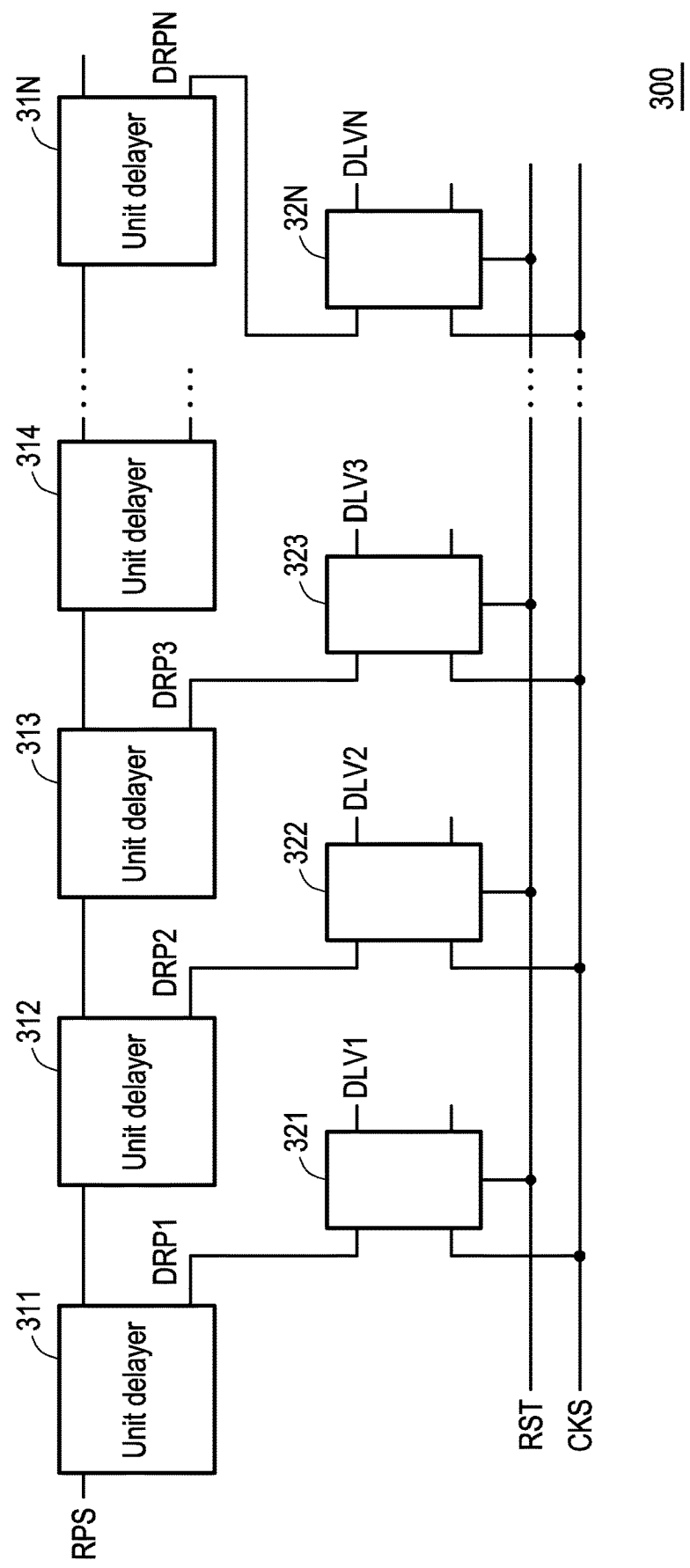
FIG. 3 is a schematic circuit diagram of a delay value generator in a clock signal generator according to an embodiment of the disclosure.

Referring to FIG. 3, a delay value generator 300 includes multiple unit delayers 311 to 31N and multiple samplers 321 to 32N. The unit delayers 311 to 31N are coupled in series with each other to form a delay string. The unit delayer 311 of the first stage receives the reference pulse signal RPS, and the unit delayers 311 to 31N sequentially delay the reference pulse signal RPS to respectively generate multiple delayed pulse signals DRP1 to DRPN. The samplers 321 to 32N are respectively coupled to the unit delayers 311 to 31N. The samplers 321 to 32N jointly receive a sampling clock signal CKS and a reset signal RST. The samplers 321 to 32N respectively sample the delayed pulse signals DRP1 to DRPN according to the sampling clock signal CKS, and respectively generate multiple bits DLV1 to DLVN of the sampled values.

In this embodiment, the samplers 321 to 32N may be D-type flip-flops.

In this embodiment, the unit delayers 311 to 31N may respectively provide the same unit delay. The time length of the unit delay is less than the pulse width of the reference pulse on the reference pulse signal RPS. The sampling clock signal CKS may be one of the control signal TCKT and the control signal TCKC in the embodiment of FIG. 2. The samplers 321 to 32N may generate the bits DLV1 to DLVN which are respectively sampled values of logic value of 1, 1 . . . 0, 0 according to the sampling performed by the clock signal CKS. The number of bits in the bits DLV1 to DLVN that are consecutively the logic value of 1 may represent the pulse width of the reference pulse on the reference pulse signal RPS.

Figure 4:
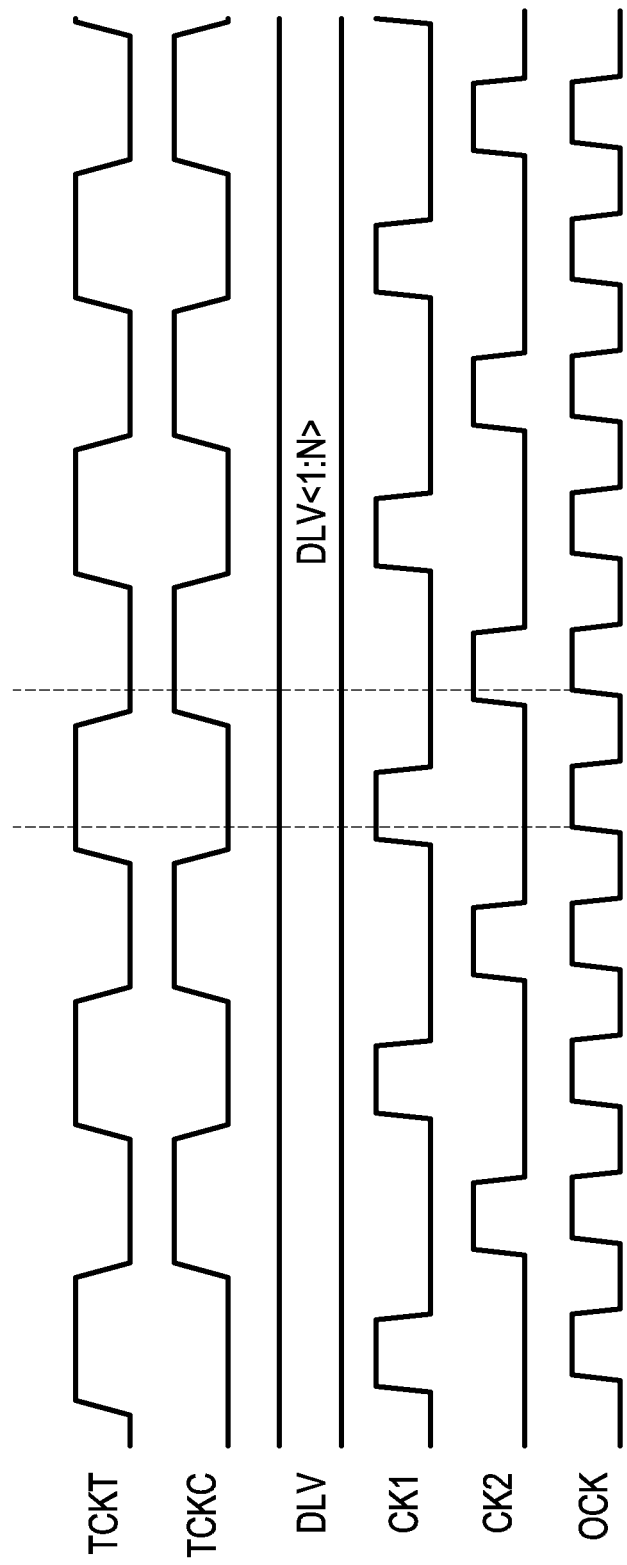
FIG. 4 is an operation waveform diagram of the clock signal generator according to the embodiment of the disclosure.

Referring to FIG. 2 and FIG. 4 synchronously, the sub-delay value generator 231 and the sub-delay value generator 232 provide the same delay value DLV (with the bits DLV<1:N>) to the delay string 211 the delay string and 221. The oscillator 210 generates the first clock signal CK1 according to the delay value DLV and the control signal TCKT, and the oscillator 220 generates the second clock signal CK2 according to the delay value DLV and the control signal TCKC. The output clock signal generator 240 combines the first clock signal CK1 and the second clock signal CK2 to generate the output clock signal OCK. In FIG. 4, the phases of the control signal TCKT and the control signal TCKC are opposite to one another. When the control signal TCKT is a logic value of 1, the first clock signal CK1 may be changed to a logic value of 1, and when the control signal TCKT is a logic value of 0, the first clock signal CK1 remains equal to the logic value of 0. In addition, when the control signal TCKC is a logic value of 1, the second clock signal CK2 may be changed to a logic value of 1, and when the control signal TCKC is a logic value of 0, the first clock signal CK2 remains equal to the logic value of 0. Therefore, the first clock signal CK1 and the second clock signal CK2 may be clock signals with a certain phase difference, and the frequencies of the first clock signal CK1, the second clock signal CK2, the control signal TCKT and the control signal TCKC may be the same.

In addition, the output clock signal OCK may be a combination of the first clock signal CK1 and the second clock signal CK2. The frequency of the output clock signal OCK may be twice that of the first clock signal CK1 and the second clock signal CK2. Based on the fact that the first clock signal CK1 and the second clock signal CK2 have a fixed phase difference, and the transition edges are not close to or overlap with each other, the clock signal generator 200 may provide a stable output clock signal OCK.

Figure 5:
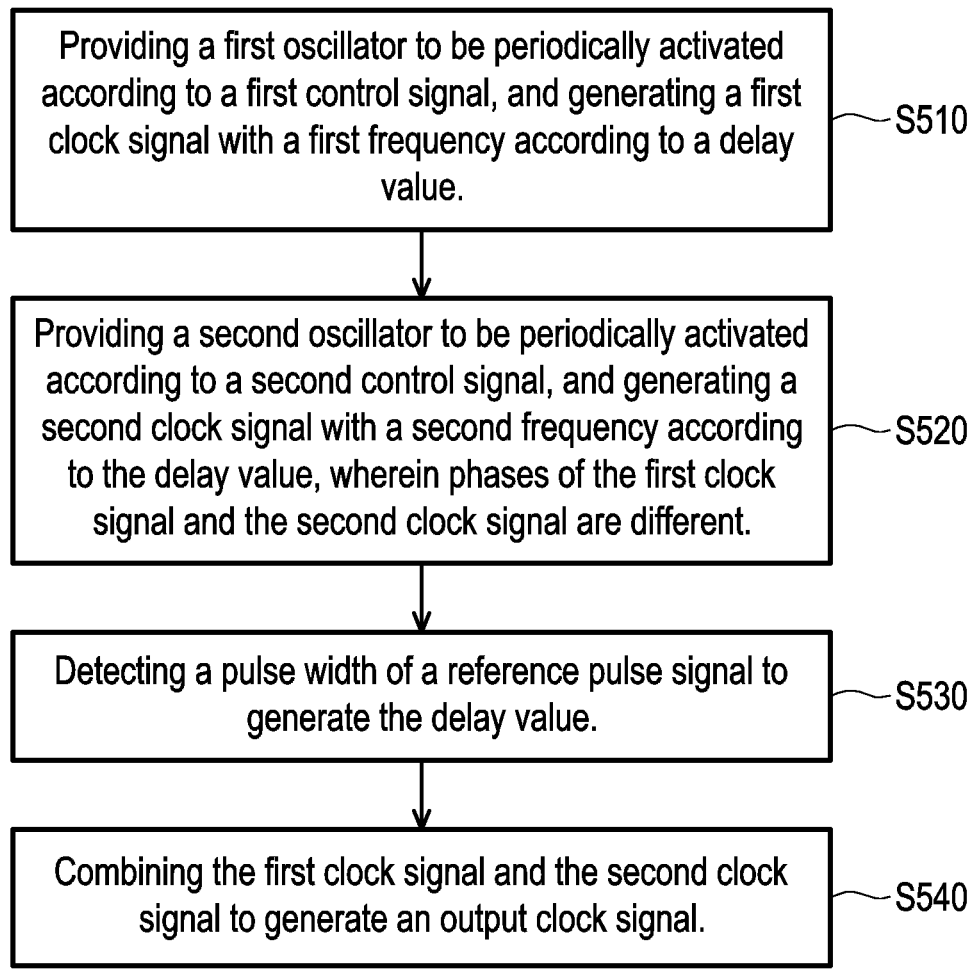
FIG. 5 is a flowchart of a clock signal generating method adapted for a test of an integrated circuit according to an embodiment of the disclosure.

Referring to FIG. 5, in step S510, a first oscillator is provided to be periodically activated according to a first control signal, and a first clock signal with a first frequency is generated according to a delay value. In step S520, a second oscillator is provided to be periodically activated according to a second control signal, and a second clock signal with a second frequency is generated according to the delay value, in which the phases of the first clock signal and the second clock signal are different, and the first frequency and the second frequency may be the same. In step S530, the pulse width of the reference pulse signal is detected to generate the delay value. In step S540, the first clock signal and the second clock signal are combined to generate an output clock signal.

The implementation details of the above steps have been described in detail in the foregoing embodiments and implementation method, and are not be repeated herein.

To sum up, the clock signal generator of the disclosure may use the test clock signal provided by the test machine as the control signal, and generate an output clock signal with double frequency accordingly. The clock signal generator of the disclosure may effectively maintain the stability of the output clock signal by activating different oscillators alternately and combining the clock signals generated by the two oscillators to generate the output clock signal. In addition to improving the speed of the test, it may also ensure the stability and correctness of the test.

What is claimed is:

1. A clock signal generator, comprising:
   a first oscillator, periodically activated according to a first control signal, the first oscillator generating a first clock signal with a first frequency according to a delay value;
   a second oscillator, periodically activated according to a second control signal, the second oscillator generating a second clock signal with a second frequency according to the delay value, wherein phases of the first clock signal and the second clock signal are different;
   a delay value generator, coupled to the first oscillator and the second oscillator, detecting a pulse width of a reference pulse signal to generate the delay value; and
   an output clock signal generator, coupled to the first oscillator and the second oscillator, combining the first clock signal and the second clock signal to generate an output clock signal.

2. The clock signal generator according to claim 1, wherein phases of the first control signal and the second control signal complement one another.

3. The clock signal generator according to claim 2, wherein the pulse width of the reference pulse signal is equal to a half period of the first control signal.

4. The clock signal generator according to claim 1, wherein the delay value generator comprises:
   a plurality of unit delayers, the unit delayers coupling to each other in series to form a delay string, the delay string receiving the reference pulse signal, and the unit delayers respectively generating a plurality of delayed pulse signals; and
   a plurality of samplers, respectively corresponding to the unit delayers, sampling the delayed pulse signals according to a sampling clock signal to generate a plurality of bits of a sampled value.

5. The clock signal generator according to claim 1, wherein the delay value generator comprises:
   a first sub-delay value generator, coupled to the first oscillator, configured to provide the delay value to the first oscillator; and
   a second sub-delay value generator coupled to the second oscillator, configured to provide the delay value to the second oscillator.

6. The clock signal generator according to claim 1, wherein the first oscillator and the second oscillator are both ring oscillators.

7. The clock signal generator according to claim 1, wherein the first oscillator further comprises:
   a first delay string; and
   a first logic gate, coupled between paths of the delay string for receiving the first control signal, two input terminals of the first logic gate respectively receiving the first control signal and the first clock signal, an output terminal of the first logic gate coupling to an input terminal of the first delay string;
   the second oscillator further comprising:
   a second delay string; and
   a second logic gate, coupled between paths of the delay string for receiving the second control signal, two input terminals of the second logic gate respectively receiving the second control signal and the second clock signal, an output terminal of the second logic gate coupling to an input terminal of the second delay string.

8. The clock signal generator according to claim 7, wherein the first logic gate is a NAND gate, and the second logic gate is a NAND gate.

9. The clock signal generator according to claim 8, wherein the output clock signal generator performs an AND logic operation on the first control signal and the first clock signal to generate a first signal, performs an AND logic operation on the second control signal and the second clock signal to generate a second signal, and performs an OR logic operation on the first signal and the second signal to generate the output clock signal.

10. The clock signal generator according to claim 1, wherein the output clock signal generator is a signal selector, configured to select the first clock signal as the output clock signal when the first control signal is a first logic value, and to select the second clock signal as the output clock signal when the second control signal is a second logic value.

11. The clock signal generator according to claim 1, wherein a frequency of the output clock signal is double of the first frequency.

12. A clock signal generating method, comprising:
  providing a first oscillator to be periodically activated according to a first control signal, and generating a first clock signal with a first frequency according to a delay value;
  providing a second oscillator to be periodically activated according to a second control signal, and generating a second clock signal with a second frequency according to the delay value, wherein phases of the first clock signal and the second clock signal are different;
  detecting a pulse width of a reference pulse signal to generate the delay value; and
  combining the first clock signal and the second clock signal to generate an output clock signal.

13. The clock signal generating method according to claim 12, wherein phases of the first control signal and the second control signal complement one another.

14. The clock signal generating method according to claim 12, wherein the pulse width of the reference pulse signal is equal to a half period of the first control signal.

15. The clock signal generating method according to claim 12, wherein detecting the pulse width of the reference pulse signal to generate the delay value comprises:
  providing a delay string formed by a plurality of unit delayers coupled in series with each other;
  receiving the reference pulse signal with the delay string and sequentially delaying the reference pulse signal to generate a plurality of delayed pulse signals; and
  generating a plurality of bits of a sampled value by sampling the delayed pulse signals according to a sampling clock signal.

16. The clock signal generating method according to claim 12, wherein combining the first clock signal and the second clock signal to generate the output clock signal comprises:
  selecting the first clock signal as the output clock signal when the first control signal is a first logic value; and
  selecting the second clock signal as the output clock signal when the second control signal is the first logic value.

17. The clock signal generating method according to claim 16, wherein selecting the first clock signal as the output clock signal when the first control signal is the first logic value, and selecting the second clock signal as the output clock signal when the second control signal is the first logic value comprises:
  performing an AND logic operation on the first control signal and the first clock signal to generate a first signal;
  performing an AND logic operation on the second control signal and the second clock signal to generate a second signal; and
  performing an OR logic operation on the first signal and the second signal to generate the output clock signal.

18. The clock signal generating method according to claim 12, wherein further comprises:
  performing a logic operation on the first control signal and the first clock signal to generate a first operation result, and transferring the first operation result to the first oscillator; and
  performing the logic operation on the second control signal and the second clock signal to generate a second operation result, and transferring the second operation result to the second oscillator.

19. The clock signal generating method according to claim 18, wherein the logic operation is AND operation or NAND operation.

20. The clock signal generating method according to claim 12, wherein a frequency of the output clock signal is double of the first frequency.

* * * * *